(12) United States Patent
Arnold

(10) Patent No.: US 6,377,080 B1
(45) Date of Patent: Apr. 23, 2002

(54) DYNAMIC LOGIC CIRCUIT

(75) Inventor: Barry J Arnold, Ft Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/561,081

(22) Filed: Apr. 28, 2000

(51) Int. Cl.[7] .......................................... H03K 19/096
(52) U.S. Cl. ............................. 326/98; 326/93; 326/95; 326/97; 326/121
(58) Field of Search .............................. 326/93, 95, 97, 326/98, 121

(56) References Cited

U.S. PATENT DOCUMENTS

| 5,903,169 A | * | 5/1999 | Kong | ........................... 326/95 |
| 6,043,696 A | * | 3/2000 | Klass et al. | .................. 327/211 |
| 6,052,008 A | * | 4/2000 | Chu et al. | .................... 327/200 |
| 6,121,796 A | * | 9/2000 | Ciraula et al. | ................. 326/98 |
| 6,184,718 B1 | * | 2/2001 | Tran et al. | ................... 326/121 |

FOREIGN PATENT DOCUMENTS

| JP | 04372222 A | * | 12/1992 | .................. 326/98 |

* cited by examiner

*Primary Examiner*—Michael Tokar
*Assistant Examiner*—Steven S. Paik

(57) ABSTRACT

A logic circuit includes a dynamic logic stage driving a dynamic evaluation stage. The dynamic logic stage responds to input signals and a clock wave to derive an output signal that is a logic function of the input signals. The output signal is derived only during a first portion of each cycle of the clock wave. The evaluation stage responds to the output signal only during an initial segment of the first portion of each clock wave cycle.

20 Claims, 5 Drawing Sheets

(PRIOR ART)

DYNAMIC LOGIC CIRCUIT

FIELD OF THE INVENTION

The present invention relates generally to logic circuits and more particularly to a logic circuit including a dynamic logic stage driving a dynamic evaluation stage, wherein the dynamic evaluation stage responds to an output signal of the dynamic logic stage for only an initial segment of a first portion of each cycle of a clock wave.

BACKGROUND ART

FIG. 1 is a circuit diagram of a dynamic logic circuit previously developed by an employee of the assignee of the present application. The circuit illustrated in the diagram of FIG. 1 has not, to my knowledge, been offered for sale or disclosed on a non-confidential basis to third parties.

The circuit of FIG. 1 includes dynamic logic stage 10, dynamic evaluation stage 12, and inverter, driver stage 14. The circuitry of FIG. 1 is complementary metal oxide semiconductor (CMOS) circuitry on an integrated circuit chip (not shown).

The circuit of FIG. 1 is responsive to binary data input signals $IN_0$, $IN_1$ ... $IN_n$ and a clock pulse train (CK) preferably having a high frequency, such as 1 gigahertz (GHz). The clock pulse train has approximately a 50 percent duty cycle so each half cycle of the 1 GHz clock pulse train has a period of approximately 500 picoseconds. First and second opposite DC power supply terminals or rails 18 and 20 are, in a preferred arrangement, respectively at $+V_{DD}$ (+1.3) volts and ground. CMOS dynamic logic stage 10, in the illustrated configuration, includes n N-channel field effect transistors (FETs) $22_0$, $22_1$ ... $22_n$, having gate electrodes respectively responsive to binary input signals $IN_0$, $IN_1$ ... $IN_n$ and parallel source drain paths connected in shunt between leads 24 and 26. Dynamic logic stage 10 also includes P-channel field effect transistor 28 and N-channel field effect transistor 30, each having a gate electrode responsive to the clock pulse wave train CK. Field effect transistor 28 has its source drain path connected between lead 24 and positive power supply terminal rail 18, while the source drain path of transistor 30 is connected between ground rail 20 and lead 26.

During alternate half cycles of the CK clock pulse wave train, when the clock pulse wave train has a low voltage (CK=0, approximately equal to the. ground potential at rail 20), the clock pulses cause the source drain paths of field effect transistors 28 and 30 to respectively have low and high impedances. The low impedance of field effect transistor 28 connects lead 24 to the positive power supply voltage on terminal or rail 18 and the relatively high source drain impedance of transistor 30 decouples lead 26 from ground rail 20 to enable parasitic capacitance 29 between lead 24 and ground to be precharged. Hence, during the alternate half clock cycles while CK has a low value, capacitance 29 is precharged to a high voltage (i.e., true or binary 1 level).

During the remaining alternate half cycles of the CK clock pulse wave train, while the clock pulse wave train has a high value (approximately equal to the voltage at rail 18), the clock causes the source drain path of field effect transistor 30 to be switched on to provide a low impedance that connects lead 26 to ground simultaneously with the source drain path of field effect transistor 28 being off to provide a high impedance that establishes a load impedance for the voltage developed at lead 24. Evaluation stage 12 detects whether the voltage on parasitic capacitance 29 is high or low while CK=1. Capacitance 29 remains charged to the high voltage while CK=1 only if all of $IN_0$, $IN_1$ ... $IN_n$ have low voltages associated with binary 0 values. If any of $IN_0$, $IN_1$ ... $IN_n$ has a high voltage, associated with a binary 1 value while CK=1, the source drain paths of transistor 30 and the transistor(s) $22_0$, $22_1$ ... $22_n$ having gate(s) responsive to a binary 1 signal provide a low impedance path from lead 24 through transistor 30 to discharge capacitance 29 essentially to ground. Based on the foregoing, field effect transistors $22_0$, $22_1$ ... $22_n$ are connected and function as a NOR logic gate during the clock pulse half cycle while CK=1.

Dynamic evaluation stage 12 responds to the bi-level binary logic signal on capacitance 29 to produce a bi-level output signal designed to have a value complementary to the signal on lead 24 during the clock pulse half cycles while CK=1. CMOS dynamic evaluation stage 12 includes complementary P-channel field effect transistor 36 and N-channel field effect transistor 34 having series connected source drain paths and gate electrodes driven in parallel by the bi-level binary logic signal on capacitance 29. The source drain paths of transistors 34 and 36 are also series connected with the source drain path of N-channel field effect transistor 38, having a gate electrode driven by the CK clock pulse wave train. The source drain paths of field effect transistors 34, 36 and 38 are series connected between power supply rails 18 and 20 so that the sources of field effect transistors 36 and 38 are respectively tied to $+V_{DD}$ rail 18 and ground rail 20.

The drains of transistors 34 and 36 have a common terminal 40, where the bi-level output signal of dynamic evaluation stage 12 is derived. Terminal 40 is tied to the gate of P-channel field effect transistor 42, having a source drain path connected between lead 24 and positive DC power supply rail 18, so that the source drain path of field effect transistor 42 shunts the source drain path of field effect transistor 28.

Field effect transistors 34 and 36 function as an inverter for the bi-level logic signal precharged on parasitic capacitance 29 while CK=1 turns on the source drain path of field effect transistor 38. Consequently, if the voltage on capacitance 29 is high while CK=1, the voltage at terminal 40 is low. The low voltage at terminal 40 forward biases the gate of transistor 42 to turn on the source drain path of transistor 42 which thereby supplies $+V_{DD}$ to capacitance 29 to maintain the voltage on capacitance 29 at the high value. If the voltage on capacitance 29 is precharged low while CK=1, the inverter comprising transistors 34 and 36 supplies a high voltage to terminal 40. The high voltage at terminal 40 back biases the source drain path of transistor 42 so the source drain path of transistor 42 does not couple $+V_{DD}$ at rail 18 to capacitance 29 while CK=1 and the voltage across capacitance 29 remains low.

To assure that the voltage at terminal 40 is high, at $+V_{DD}$, during the half cycles of the clock pulse wave train while CK=0, the source drain path of P-channel field effect transistor 44 is connected between terminal 40 and the positive power supply voltage $+V_{DD}$ at rail 18 and the gate of field effect transistor 44 is connected to be responsive to the clock pulse wave train. Thereby, during the half cycles of the clock pulse wave train while CK=0, the source drain path of field effect transistor 44 has a low impedance, to tie the voltage at terminal 40 substantially to the $+V_{DD}$ voltage on rail 18.

Inverter 14, which also functions as a driver, responds to the bi-level signal on terminal 40. Inverter 14 has the usual construction, including complementary P-channel field effect transistor 46 and N-channel field effect transistor 48, having series connected source drain paths connected between $+V_{DD}$ power supply rail 18 and ground rail 20. Field effect transistors 46 and 48 have gate electrodes driven in parallel by the bi-level signal at terminal 40 and common drain electrodes at output terminal 50 of the circuit of FIG. 1. During the half cycles of the clock pulse wave train while CK=1, the binary level at terminal 50 is supposed to be the same as the precharged binary level on capacitance 29. During the remaining, alternate half cycles of the clock pulse wave train while CK=0, the voltage at output terminal 50 is essentially at the ground potential of rail 20, by virtue of the source drain path of field effect transistor 48 being turned on by the high voltage at terminal 40.

As illustrated by the waveforms of FIG. 1A during interval T1, each of $IN_0$, $IN_1$ . . . $IN_n$ is low while CK=1, i.e., during the evaluation half-cycle of the clock. This causes the voltage across capacitor 29 and on lead 24 to be high because of capacitor 29 precharging from $+V_{DD}$ rail 18 through transistor 28 during the previous half-cycle of CK, while CK=0. In response to the high voltage across capacitor 29 and CK=1, transistors 34 and 38 turn on and transistors 36 and 44 turn off causing the voltage on terminal 40 to be low and the voltage on output terminal 50 of inverter 14 to be high. The low voltage at terminal 40 turns on transistor 42 to couple $+V_{DD}$ at rail 18 to capacitor 29 and lead 24 to keep capacitor 29 charged.

In response to a transition of CK from CK=1 to CK=0 at the beginning of interval T2, while all of $IN_0$, $IN_1$ . . . $IN_n$=0 (as illustrated in FIG. 1A) transistors 28 and 44 turn on while transistors 30 and 38 turn off. Consequently, $+V_{DD}$ charges capacitor 29 through transistor 28 and supplies a high voltage to terminal 40 via transistor 44. The high voltage across capacitor 29 has no appreciable effect on terminal 40 because CK=0 turns off transistor 38.

If one or more of $IN_0$, $IN_1$ . . . $IN_n$ (e.g., $IN_0$) goes high while CK=0 during the latter portion of interval T2, as illustrated by the waveforms of FIG. 1A, the voltage across capacitor 29 and on lead 24 stays high because CK=0 turns on transistor 28 and turns off transistor 30, so transistor 28 still couples $+V_{DD}$ at rail 18 to capacitor 29 while transistor 30 provides a high impedance between ground rail 20 and lead 24. Because CK=0 turns off transistor 38 and turns on transistor 44, transistor 44 maintains terminal 40 at $+V_{DD}$ and the high voltage across capacitor 29 has no effect on the voltage at terminal 40 or output terminal 50.

During the next clock half-cycle, when CK=1 as indicated by T3 in FIG. 1A, the voltage across capacitor 29 and on lead 24 drops substantially to ground because of the low impedance path to ground from lead 24 through transistors $22_0$ and 30. The low voltage on lead 24 turns off transistor 34 and has no substantial effect on the high voltage on terminal 40 which is coupled to $+V_{DD}$ through transistor 44. Hence, in the normal operation of FIG. 1, as illustrated in FIG. 1A, the voltage at output terminal 50 during the clock evaluation phase (i.e., CK=1) has a high level only if all of $IN_0$, $IN_1$ . . . $N_n$=0. The voltage at terminal 50 is always low during the clock precharge phase (i.e., CK=0) and is low during the clock evaluation phase if any of $IN_0$, $IN_1$ . . . $N_n$=1.

I have discovered that the circuit of FIG. 1 has two problems; viz: (1) the binary values of $IN_0$, $IN_1$ . . . $N_n$ must remain stable during the entire clock pulse wave train half cycle while CK=1 to avoid a glitch in the binary signal at terminal 50 during the clock half cycle while CK=1, and (2) there is a tendency for the binary logic signal on lead 24 to be coupled improperly through dynamic evaluation stage 12.

The glitch occurs if (1) all of $IN_0$, $IN_1$ . . . $IN_n$ have binary 0 values at the beginning of a first clock cycle while CK=1, and (2) some time toward the end of the first clock cycle while CK=1, one of these values changes from 0 to 1. I have found such a situation is likely to occur because logic signals for the next, (i.e., second) clock cycle while CK=1 are likely to arrive at the gate of one or more of transistors $22_0$, $22_1$ . . . $22_n$ prior to the end of the first half cycle while CK=1. In such a situation, the voltage on lead 24 changes from a high value to a low value some time during the evaluate portion of the first clock cycle while CK=1. The transition from a high to a low voltage on lead 24 during the latter portion of the first clock cycle while CK=1 causes changes in the voltage across capacitance 29 and in the states of the source drain paths of field effect transistors 34, 36 and 42, so that the voltage at terminal 40 changes from a substantially ground level at rail 20, to a high level, equal substantially to the voltage at rail 18. Consequently, the voltage at output terminal 50 of the logic circuit of FIG. 1 changes before the completion of the first clock cycle while CK=1. Circuits responsive to the voltage at terminal 50 thus are likely to respond to the incorrect binary value from the circuit of FIG. 1.

The circuit of FIG. 1 also operates incorrectly and produces a glitch at terminal 50 if any of $IN_0$, $IN_1$ . . . $IN_n$, e.g., $IN_0$, has a low to high transition while CK=1. In normal operation if all of $IN_0$, $IN_1$ . . . $IN_n$, have low voltages at all times while CK=1, as indicated by interval T1, FIG. 1A, a high voltage is at terminal 50 during CK=1. If there is a low to high voltage transition of any of $IN_0$, $IN_1$ . . . $IN_n$ while CK=0 and the high voltage persists during CK=1, the voltage at terminal 50 stays low as indicated by T2 and T3. However, if any of $IN_0$, $IN_1$ . . . $IN_n$ changes from low to high while CK=1, the voltage at terminal 50 goes up in synchronism with the low to high transition and goes down in synchronism with a CK=1 to CK=0 transition.

As illustrated in FIG. 1B, $IN_0$ has a low to high transition during interval T4, between the leading, positive going and trailing, negative going edges of a positive CK half-cycle. The values of $IN_0$=1 and CK=1 respectively cause turn on of transistors $22_0$ and 30 to discharge capacitor 29 and pull down lead 24 substantially to the ground voltage of rail 20. The low voltage on lead 24 turns off transistor 34 and turns on transistor 36 to decouple terminal 40 from ground rail 20 and couple $+V_{DD}$ from rail 18 to terminal 40. Consequently, the voltages at terminal 40 and terminal 50 respectively go up and down until the next CK=1 to CK=0 transition occurs, at which time the voltages at terminal 40 and terminal 50 respectively return to the correct high and low values thereof. The low to high and then high to low transitions during interval T4 are undesirable glitches.

With regard to problem (2), the clock pulse wave train is supplied simultaneously to the gates of each of field effect transistors 28, 30, 38 and 44. Because of leakage factors, transitions on lead 24 are likely to be improperly coupled through dynamic evaluation stage 20 and not drive inverter 14 properly when the integrated circuit is operated at test frequencies that are considerably lower than normal operating frequencies.

FIG. 1C is a series of waveforms for the improper operation of the circuit of FIG. 1 if the value of any of $IN_0$, $IN_1$ . . . $IN_n$ (e.g., $IN_0$) has a 0 to 1 transition while CK=0 (during interval T5) and then has a 1 to 0 transition while CK=1 (during interval T6). Ideally, under this situation, the voltage at output terminal 50 should remain low during intervals T5 and T6, as discussed previously in connection with intervals T2 and T3 of FIG. 1A. However, in response to the $IN_O=1$ to $IN_O=0$ transition during T6, the voltage at terminal 50 incorrectly changes from a low to a high value, a condition that exists until there is a CK=1 to CK=0 transition. The operation in response to the $IN_O=0$ to $IN_O=1$ transition during T5 and the first part of T6 is the same as in response to the $IN_O=0$ to $IN_O=1$ transition during T2 and T3. However, when the $IN_O=1$ to $IN_O=0$ transition occurs during T6, the low impedance path from ground to lead 24 is no longer present and lead 24 floats. There is a tendency for capacitor 29 to be charged because of the floating condition of lead 24. The charge on capacitor 29 can, under certain circumstances, accumulate to such an extent that the voltage on lead 24 exceeds the threshold, i.e., trigger voltage, for the gate electrode of transistor 34. Such an accumulation of charge is most likely if the frequency of clock is considerably lower than normal, e.g., the clock frequency for the integrated circuit of which the circuit of FIG. 1 is a part is reduced from a normal value of 1 GHz to a frequency of 100 MHz during testing.

In response to the voltage on lead 24 exceeding the trigger voltage of transistor 34 while CK=1 the low impedances of transistors 34 and 38 pull the voltage on terminal 40 down substantially to that of ground rail 20. Consequently, the voltage at output terminal 50 goes high until the next occurrence of a CK=1 to CK=0 transition. The CK=1 to CK=0 transition turns off transistor 38 and turns on transistor 44 to drive terminal 40 and output terminal 50 to high and low voltages, respectively.

It is, accordingly, an object of the present invention to provide a new and improved logic circuit including a dynamic logic stage and a dynamic evaluation stage.

Another object of the present invention is to provide a new and improved CMOS logic circuit including a dynamic logic stage and a dynamic evaluation stage wherein binary signals supplied to the dynamic logic stage do not have to remain stable during a half cycle of a clock pulse wave train while the evaluation stage is enabled.

An additional object of the present invention is to provide a new and improved CMOS logic circuit including a dynamic logic stage and a dynamic evaluation stage wherein glitches in a binary output signal of the logic circuit are avoided even though binary input signals to the logic stage do not remain stable throughout a half cycle of a clock pulse train during which the evaluation stage is enabled.

A further object of the invention is to provide a new and improved logic circuit having a dynamic logic stage and a dynamic evaluation stage, wherein the stages are activated in response to a clock pulse wave train so that a "race" does not occur between activation of the evaluation stage and the output of the logic stage.

SUMMARY OF THE INVENTION

In accordance with one aspect of the present invention, a logic circuit, including a dynamic logic stage driving a dynamic evaluation stage, is operated by (1) supplying input signals and a clock wave to the dynamic logic stage, (2) deriving from the dynamic logic stage a binary signal that is a logic function of the input signals only during a first portion of each cycle of the clock wave, (3) applying the binary signal and the clock wave to the evaluation stage, and (4) activating the evaluation stage so it is responsive to the binary signal for a period that subsists for only an initial segment of the first portion of each cycle of-the clock wave.

Another aspect of the invention relates to a logic circuit adapted to be responsive to plural binary input signals and a clock wave, wherein the logic circuit comprises (1) a dynamic logic stage connected to be responsive to the binary input signals and the clock wave for deriving a binary logic signal that subsists only during a first portion of each cycle of the clock wave, and (2) a dynamic evaluation stage connected to be responsive to the binary logic signal and the clock. The evaluation stage is arranged to respond to the binary logic signal only during an initial segment of the first portion of each clock cycle.

A further aspect of the invention concerns a CMOS logic circuit adapted to be responsive to plural binary input signals and a clock wave. The CMOS logic circuit comprises first and second DC power supply terminals, a dynamic logic stage and a dynamic evaluation stage. The dynamic logic stage has plural field effect transistors connected to be responsive to the plural binary input signals and the clock wave. The logic stage derives a bi-level logic signal having values determined by (1) the values of the input signals and (2) connections of the plural field effect transistors of the dynamic logic stage. The field effect transistors of the dynamic logic stage have source drain paths connected to the first and second DC power supply terminals and are turned on and off in response to the clock wave. The dynamic logic stage is arranged to derive the bi-level logic signal only during a first portion of each cycle of the clock wave. The first portion of successive cycles of the clock wave alternate with second portions of successive cycles of the clock waves. The bi-level signal has a true value in response to the binary input signals having a predetermined relation.

The dynamic evaluation stage responds to the bi-level logic signal, as well as the clock wave and includes complementary field effect transistors having (a) source drain paths connected in a series circuit to the first and second DC power supply terminals, and (b) gate electrodes responsive to the bi-level logic signal. The evaluation stage has an output terminal in the series circuit. Circuitry responsive to the bi-level logic signal and the clock causes the complementary field effect transistors to be responsive to the bi-level logic signal only during an initial segment of the first portion of each clock cycle.

The above and still further objects, features and advantages of the present invention will become apparent upon consideration of the following detailed descriptions of plural specific embodiments thereof, especially when taken in conjunction with the accompanying drawings.

BRIEF DESCRIPTION OF THE DRAWINGS

As described.

DETAILED DESCRIPTION OF THE DRAWINGS

Figure 1:
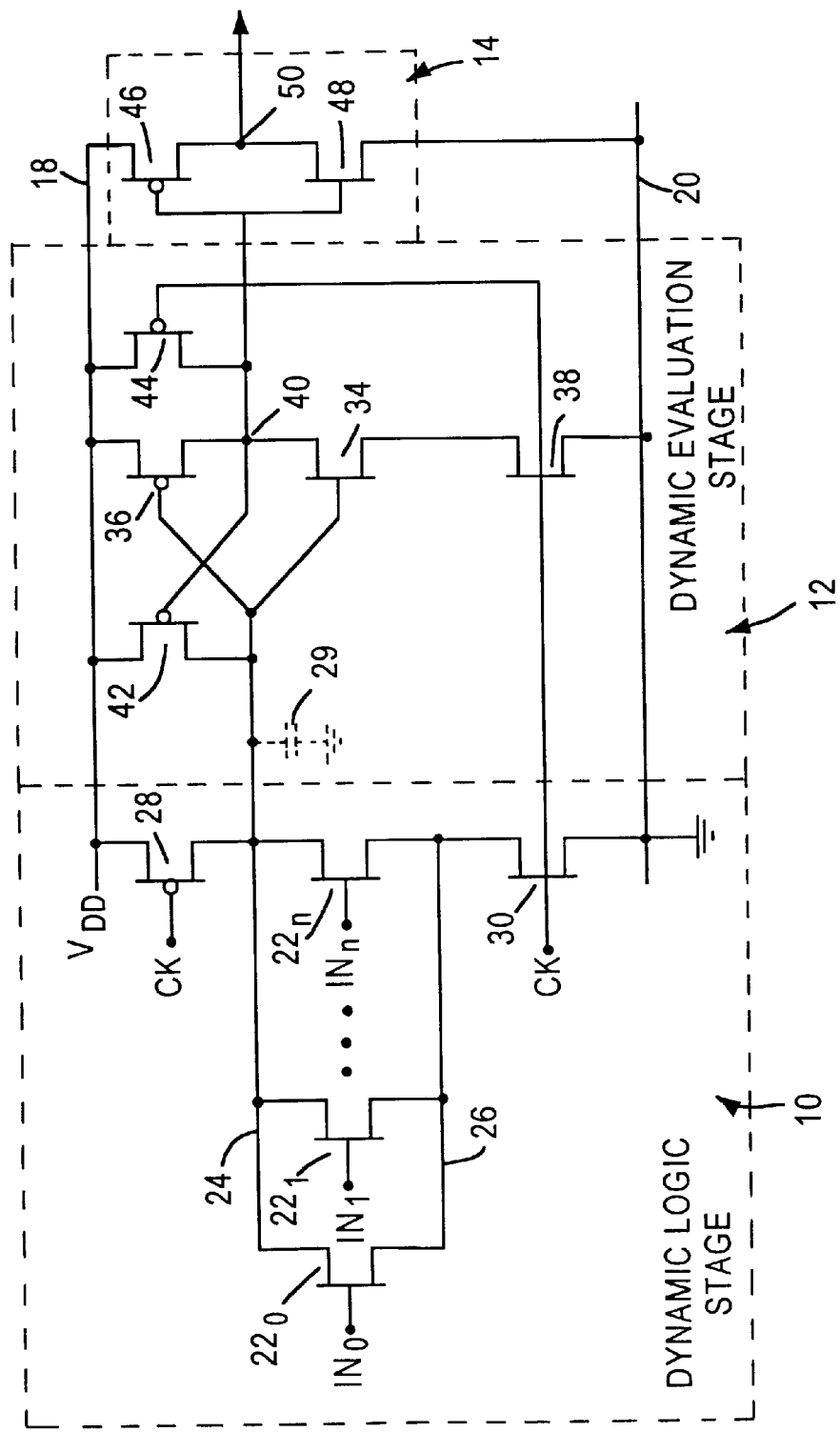
FIG. 1 is a circuit diagram of a previously developed CMOS logic circuit including a dynamic logic stage and a dynamic evaluation stage and FIGS. 1A, 1B and 1C include waveforms helpful for describing the operation of FIG. 1.
Figure 1A:
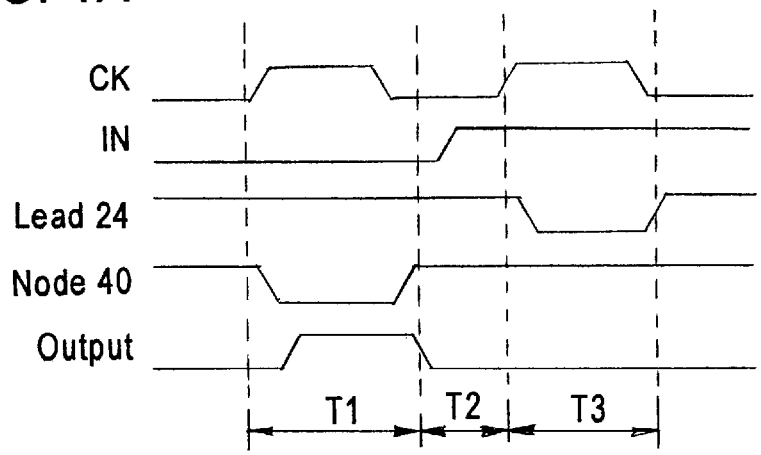
Figure 2:
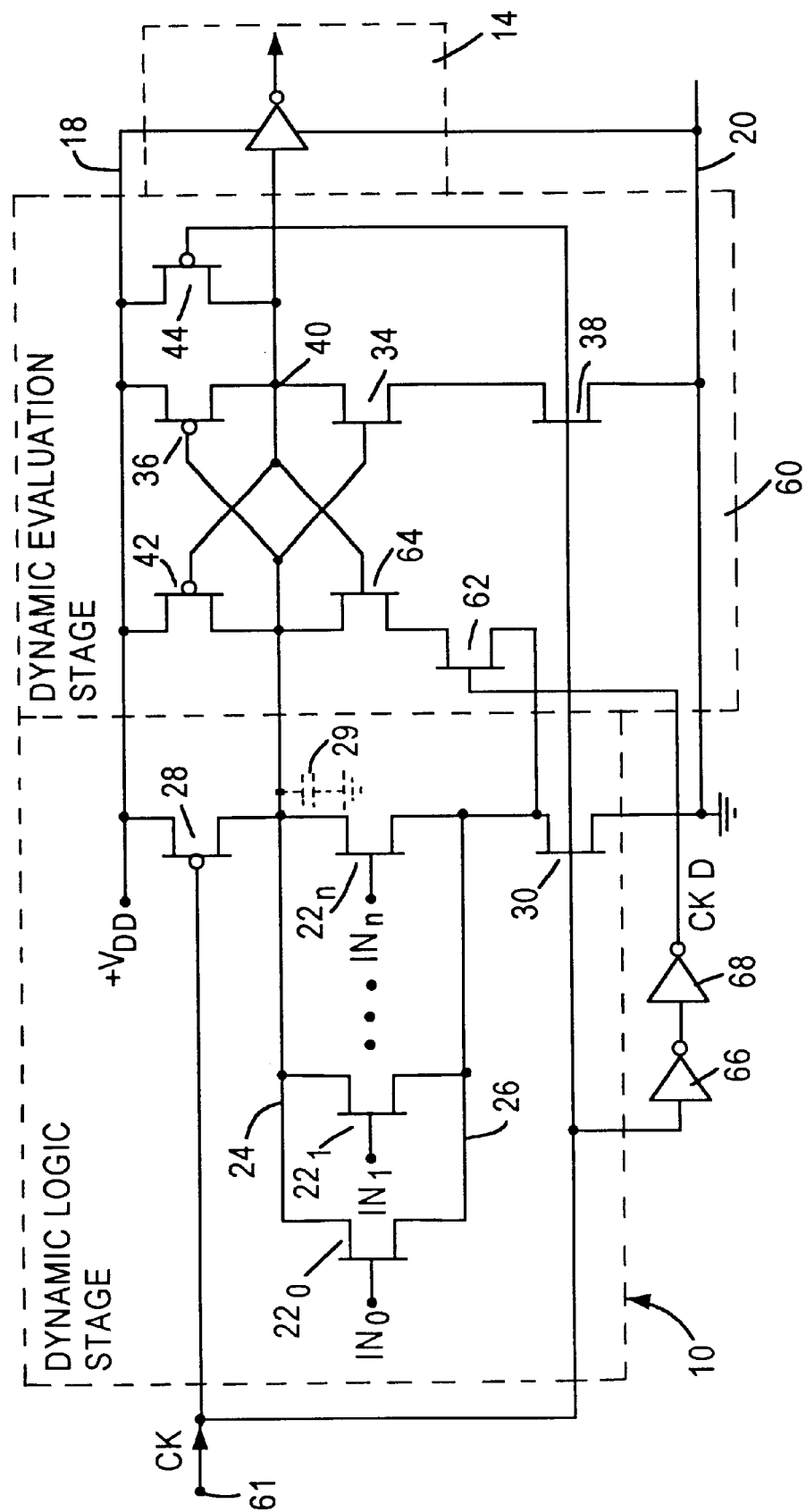
FIG. 2 is a circuit diagram of a first embodiment of a logic circuit in accordance with a preferred embodiment of the present invention, wherein the circuit includes a dynamic logic stage and a dynamic evaluation stage.

Reference is now made to FIG. 2 of the drawing, wherein CMOS dynamic logic stage 10 and CMOS inverter 14 are constructed identically to the dynamic logic stage 10 and inverter 14 of FIG. 1. Consequently, no further description of dynamic logic stage 10 or inverter 14 is necessary with regard to FIG. 2.

CMOS dynamic evaluation stage 60 of FIG. 2 differs from dynamic evaluation stage 12 of FIG. 1 because the dynamic evaluation stage of FIG. 2 includes cascaded, delay introducing inverters 66 and 68 as well as two additional N-channel field effect transistors 62 and 64. Inverters 66 and 68 are similar to inverter 14 as described supra and include relatively wide gate widths to introduce a substantial delay (a few picoseconds) in the clock waves applied to them.

Field effect transistors 62 and 64 have series connected source drain paths connected in shunt with parasitic capacitance 29 and the parallel source drain paths of transistors $22_0, 22_1 \ldots 22_n$, i.e., the series connected source drain paths of transistors 62 and 64 are connected in parallel between leads 24 and 26 and in series with the source drain paths of field effect transistors 30 and 42. Field effect transistor 62 has a gate driven by a delayed replica (CKD) of the CK clock wave pulse train, at the output of inverter 68. The delay is approximately 10% of a cycle of the clock pulse train, i.e., approximately 100 ps, a result achieved by connecting cascaded inverters 66 and 68 between input terminal 61 for the clock pulse train applied to the logic circuit of FIG. 2 and the gate of field effect transistor 62. Hence, the leading edges of CK=0 to CK=1 transitions occur about 100 ps before the leading ledges of CKD=0 to CKD=1 transitions. Because the total delay time of inverters 66 and 68 is about 100 ps, the positive going transition at the output of inverter 68 turns on the source drain path of field effect transistor 62 approximately 100 ps after the CK positive going transition turns on the source drain paths of field effect transistors 30 and 38. The negative going transition of CKD at the output of inverter 68 turns off the source drain path of transistor 62 approximately 100 ps after the CK negative going transition turns off the source drain paths of field effect transistors 30 and 38.

The series connections of the source drain paths of field effect transistors 30 and 62, and the connections of the gate electrodes thereof to the CK clock wave train and the CKD delayed clock wave train (1) enable dynamic evaluation stage 60 to detect the voltage on capacitance 29 for a period that starts when the evaluate phase begins (i.e., when there is a CK=0 to CK=1 transition) and ends approximately 100 ps after the CK=0 to CK=1 transition and (2) thereafter prevents dynamic evaluation stage 60 from detecting the voltage on capacitance 29 until the next CK=0 to CK=1 transition.

During the precharge clock half cycle while CK=0, the voltages on lead 24, capacitance 29 and terminal 40 are high regardless of the values of $IN_0, IN_1 \ldots IN_n$ because the CK=0 value back biases FETs 30 and 38 and forward biases FETs 28 and 44.

The value of CKD has no effect on the voltages on lead 24 and terminal 40 while CK=0. The CKD=0 value turns off transistor 62 so the voltages across capacitor 29 and at terminal 40 are not affected. At the beginning of the period when CK=0, i.e, when CK=0 CKD=1 and the $+V_{DD}$ voltage transistor 28 supplies to capacitor 29 and the $+V_{DD}$ voltage transistor 36 supplies to terminal 40 maintain terminal 40 at the $+V_{DD}$ level. In addition, at this time no low impedance path exists from terminal 40 to ground. This is because CK turns off transistor 38 and the gate to ground impedance of transistor 64 is high because of the inherent impedance characteristics of transistor 64 and the high source drain impedance of transistor 30 that is cut off by CK=0. The CK=0 clock wave value at the gate of field effect transistor 44 turns on the source drain path of field effect transistor 44 to connect terminal 40 to the $+V_{DD}$ voltages at positive power supply rail 18. The low clock voltage (CK=0) applied to the gate of field effect transistor 28 turns on the source drain path of field effect transistor 28 to pull the voltage on lead 24 up to $+V_{DD}$. The high voltage on lead 24 turns on the source drain path of field effect transistor 34, while turning off the source drain path of transistor 36. The CK=0 value of the clock source turns off the source drain paths of field effect transistors 30 and 38, to decouple the source drain paths of transistors $22_0, 22_1 \ldots 22_n$ and field effect transistor 34 from the ground potential of rail 20. Hence, the values of input signals $IN_0, IN_1 \ldots IN_n$ have no effect on the voltages at terminal 40 or on lead 24 during the half cycle of the clock wave while CK=0, and inverter 14 responds to the high voltage at terminal 40 to derive a low output voltage while CK=0.

Field effect transistor 64, in combination with field effect transistors 42 and 62, latches dynamic evaluation stage 60 into a state commensurate with the bi-level logic signal on lead 24 and capacitance 29 when the CKD=0 to CKD=1 transition occurs, i.e., approximately 100 ps after the positive going transition of CK=0 to CK=1 initially enables dynamic evaluation stage 60.

Initially, consider the situation wherein one or more of $IN_0, IN_1 \ldots IN_n$ has a binary one value, associated with a high voltage (equal approximately to the $+V_{DD}$ voltage of rail 18) when the CK=0 to CK=1 transition occurs. The binary one value of at least one of $IN_0, IN_1 \ldots IN_n$ applied to the gate electrode of the corresponding FET $22_0, 22_1 \ldots 22_n$ turns on the corresponding FET source drain path to provide a low impedance between leads 24 and 26 so there is a low voltage across capacitance 29.

During the approximately 100 picosecond interval while CK=1 and CKD=0, CK=1 forward biases the gate electrodes of FETs 30 and 38 while back biasing the gate electrodes of FETs 28 and 44. The forward gate bias of FET 30 causes turn on of FET 30 to couple a low voltage from rail 20 to lead 26. The turned on FET(s) $22_0, 22_1 \ldots 22_n$ couple a low voltage from lead 26 to lead 28. The low voltage on lead 24 turns off FET 34 and turns on FET 36, to couple the $+V_{DD}$ voltage at rail 18 to terminal 40. The resulting high voltage at terminal 40 forward biases the gate of FET 64 while back biasing the gate of FET 42. Consequently lead 24 is not coupled to the $+V_{DD}$ voltage of rail 18 through the source drain path of FET 42. Forward biasing the gate of FET 64 has no effect on the voltage on lead 24 when CK=1 and CKD=0 because the low CKD=0 voltage inverter 68 supplies to the gate of FET 62 turns off the source drain path of FET 62. Consequently when there is a CKD=0 to CKD=1 transition at the output of inverter 68 the voltage at terminal 40 is high and the output of inverter 14 is low when any of $IN_0, IN_1 \ldots IN_n$ has a binary 1 value.

The high voltage at terminal 40 persists if there is an instability of $IN_0, IN_1 \ldots IN_n$ which causes all of $IN_0, IN_1 \ldots IN_n$ to have low voltages (i.e., binary zero values) during the remainder of the evaluate phase, i.e., while CK=1 and CKD=1. Under such circumstances, the low voltage on lead 26 is not coupled to lead 24 and capacitance 29 because there is no low impedance path through any of FETs $22_0, 22_1 \ldots 22_n$. However, the high voltage at terminal 40 tends to persist on the gate of FET 64 because the voltage across capacitance 29 tends to remain low so FET 36 stays on and FET 34 stays off. Consequently, FET 36 applies $+V_{DD}$ to terminal 40 to forward bias the gate of FET 64. Simultaneously CKD=1 turns on FET 62 and CK=1 turns on FET 30 to provide a low impedance path across capacitance 29 to ground so the voltage across capacitance 29 stays low. The low voltage across capacitance 29 forward biases the gate of FET 36 to maintain terminal 40 at the high voltage until the next CK=1 to CK=0 transition occurs.

Next consider the situation wherein all of $IN_0, IN_1 \ldots IN_n$ have low voltage binary zero values during the precharge portion of the cycle while CK=0. Under this circumstance, there is no low impedance path from lead 24 through the source drain paths of any FETs $22_0, 22_1 \ldots 22_n$ to ground, and capacitance 29 is precharged to $+V_{DD}$ at rail 18 through the source drain path of FET 28. Capacitance 29 is not coupled to a low voltage through FETs 62 and 64 because CK=0 back biases the gate of FET 30. CK=0 forward biases FET 44 to couple terminal 40 to the $+V_{DD}$ voltage at rail 18. Consequently the voltage across capacitance 29 is high, at $+V_{DD}$, at the time of the CK=0 to CK=1 transition and remains high until the CKD=0 to CKD=1 transition occurs about 100 ps after the CK=0 to CK=1 transition. However, because capacitance 29 had a high voltage immediately before the CK=0 to CK=1 transition the gate of FET 34 remains forward biased after the CK=0 to CK=1 transition. The forward bias CK=1 applies to the gate of FET 38 in combination with the forward bias of FET 34 establishes a low impedance between terminal 40 and ground rail 20 to pull down the voltage at terminal 40. The low voltage at terminal 40 turns on FET 42 to couple the $+V_{DD}$ voltage at rail 18 to lead 24 and capacitance 29 so the high voltage stays on capacitance 29 until there is CKD=0 to CKD=1 transition.

After the CKD=0 to CKD=1 transition instability of any of $IN_0, IN_1 \ldots IN_n$ has no effect on stage 60. This is because the low voltage at terminal 40 keeps FET 42 forward biased so capacitance 29 is charged to the $+V_{DD}$ high voltage. The low voltage at terminal 40 also back biases the gate of FET 64 so that the source drain path of FET 62 has no effect on the voltage at terminal 40. The forward biased source drain impedance of FET 42 is considerably smaller than the forward biased source drain impedance of any of FETs $22_0, 22_1 \ldots 22_n$, in series with the forward biased source drain impedance of FET 30 during the remaining interval while CK=1 so that the voltage across capacitance 29 remains high enough to keep FET 34 forward biased and terminal 40 at a low voltage. The voltage at terminal 40 remains low, below the threshold of inverter 14 so the inverter output stays high during the interval starting at the CKD=0 to CKD=1 transition and ending at the beginning of the next precharge half cycle when there is a CK=1 to CK=0 transition.

Figure 1B:
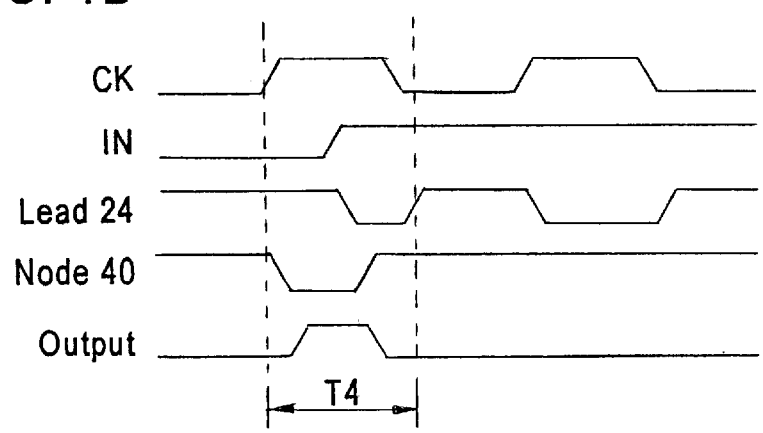
Figure 1C:
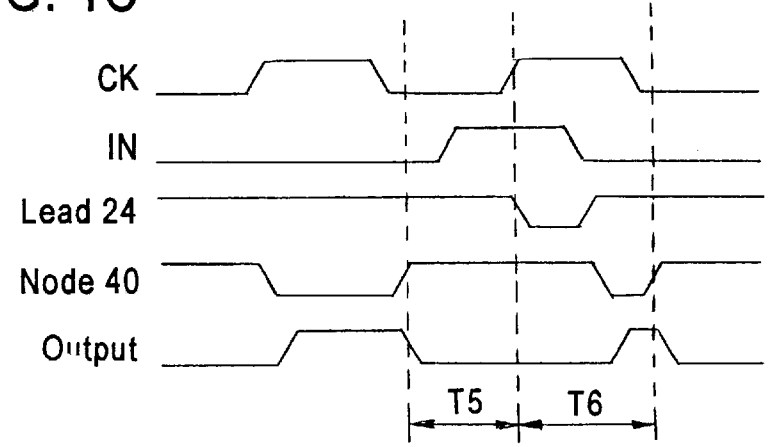
Figure 2A:
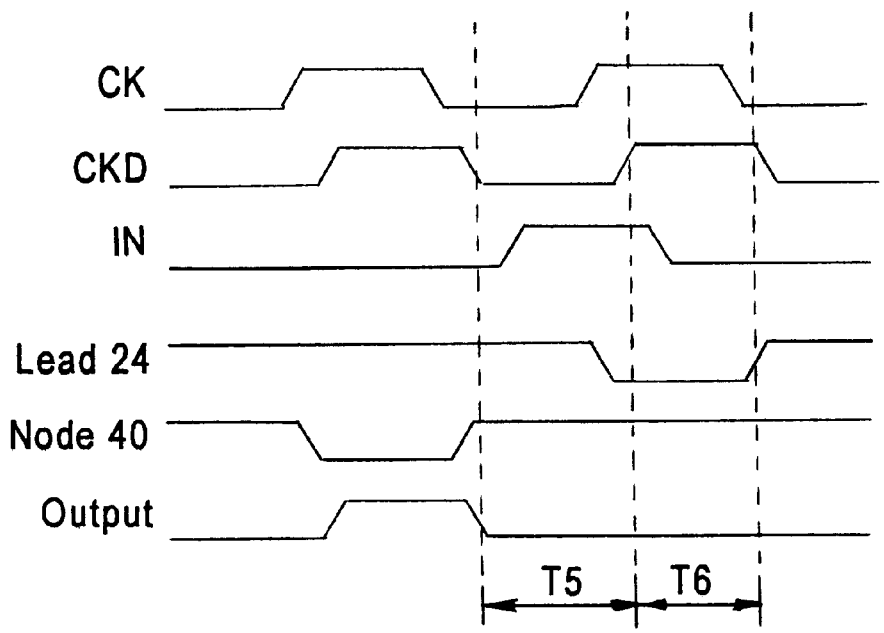
FIG. 2A includes a series of waveforms helpful for describing the operation of FIG. 2.

As indicated by the waveforms of FIG. 2A, the circuit of FIG. 2 does not have the same problems as the circuit of FIG. 1 for the situation of FIG. 1C, i.e., a high to low transition of any of $IN_0, IN_1 \ldots IN_n$ while CK=1, during T6. If such a transition of, e.g., $IN_0$, occurs in the circuit of FIG. 2, the voltage on lead 24 stays low until the next CK=1 to CK=0 transition occurs and lead 24 cannot float as can occur with the circuit of FIG. 1. In particular, the CKD=1 output of inverter 68 turns on transistor 62 while terminal 40 is applying a high voltage to the gate electrode of transistor 64. Because transistors 62 and 64 are both on and CK=1 turns on transistor 30, a low impedance path exists between the ground voltage at rail 20 and terminal 40. Terminal 40 is at a high voltage during T5 because CK=0 turns on transistors 28 and 44 to respectively couple lead 24 and terminal 40 to $+V_{DD}$ at rail 18 and because CK=0 turns off transistor 38 to decouple terminal 40 from ground rail 20. This action to drive terminal 40 to $+V_{DD}$ occurs regardless of the voltage variations on lead 24 in response to transitions of any $IN_0, IN_1 \ldots IN_n$.

In the example of FIG. 2A, during the next half-cycle of CK, when CK=1 during T6, $IN_0$ has a high to low transition and the low impedance path to ground rail 20 no longer exists through transistor $22_0$. However, transistors 30, 62 and 64 continue to provide a low impedance path from lead 24 to ground rail 20 to prevent floating of lead 24. Hence, the problem described above in connection with FIGS. 1 and 1C is overcome. Because the voltage at terminal 40 remains high during T6, the voltage at terminal 50 stays low and the glitch that was developed during T6 with the circuit of FIG. 1 does not occur.

Figure 3A:
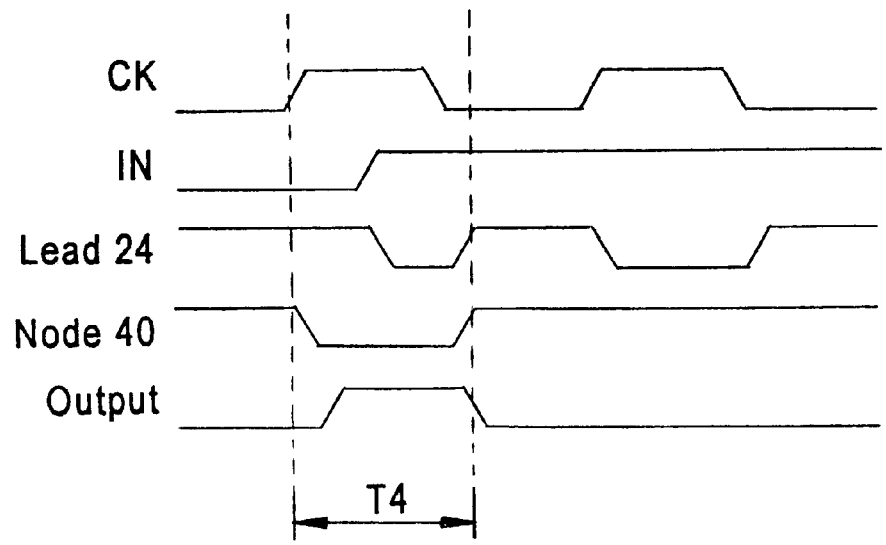
FIG. 3A includes a series of waveforms helpful for describing the operation of FIG. 3.
Figure 3:
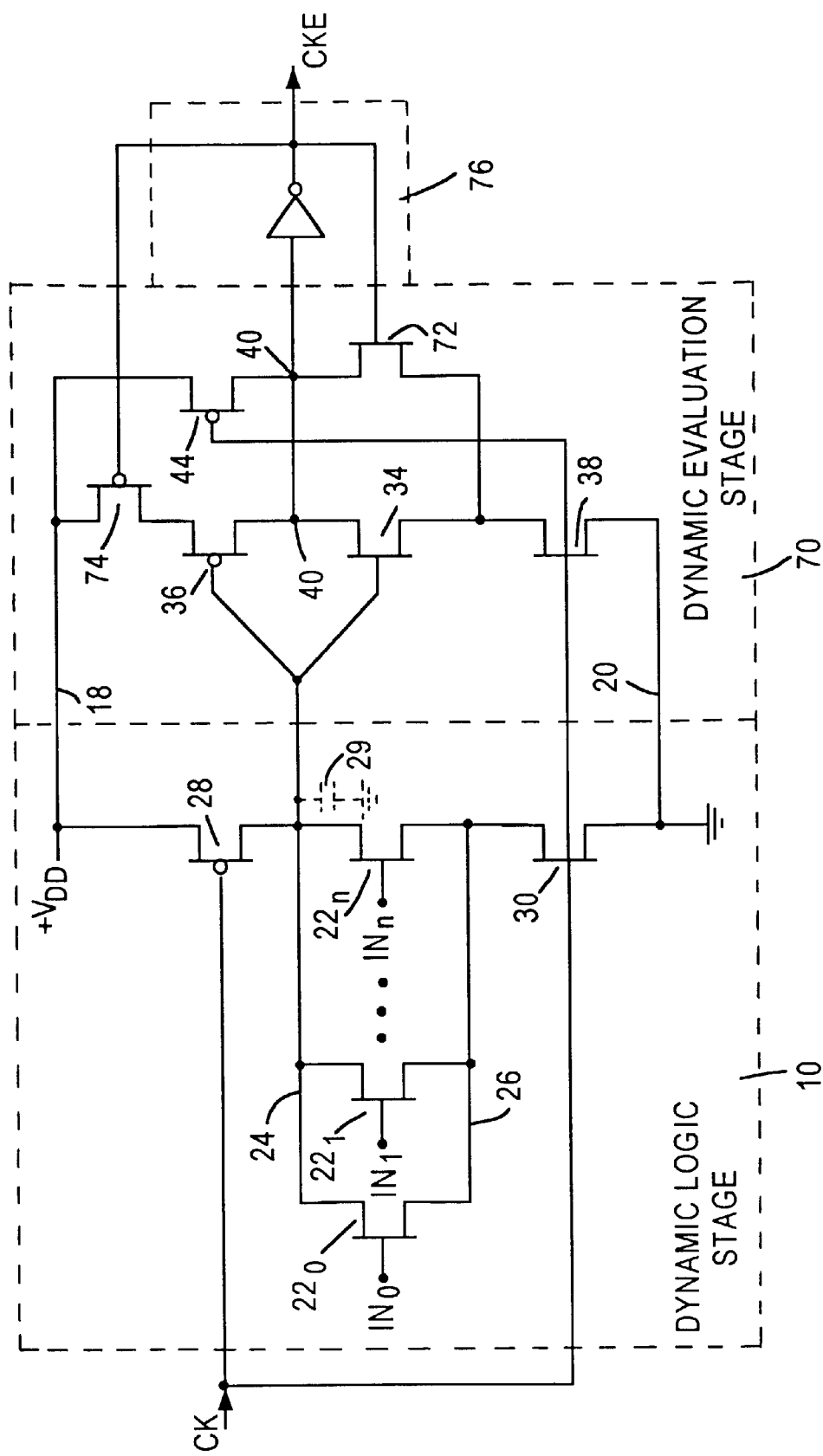
FIG. 3 is a circuit diagram of a further embodiment of the invention, including dynamic logic and evaluation stages.

A further embodiment of the invention is illustrated in FIG. 3, which includes a dynamic logic stage 10 that is identical to the dynamic logic stage of FIG. 1. Dynamic CMOS evaluation stage 70 of FIG. 3 includes field effect transistors 34, 36, 38 and 44, which have the identical connections as field effect transistors 34, 36, 38 and 44 of FIG. 1. The circuit of FIG. 3, however, does not include field effect transistors 42, 62 or 64, nor does it include inverters 66 and 68. Instead, the circuit of FIG. 3 includes N-channel field effect transistor 72 and P-channel field effect transistor 74.

The circuit of FIG. 3 also includes inverter 76, that is configured similar to inverter 14 of FIG. 1. However, inverter 76 introduces a time delay of approximately 100 ps, i.e., approximately 10% of a 1 GHz clock pulse cycle time, between the transitions at the input and output thereof. To provide consistency between FIGS. 2 and 3, the output of inverter 76 is referred to as CKE. The bi-level signal inverter 76 derives is fed back to the gate electrodes of complementary field effect transistors 72 and 74. Consequently, the source drain path of field effect transistor 72 is respectively on and off while inverter 76 derives high and low voltage output levels and the source drain path of field effect transistor 74 is respectively on and off while inverter 76 derives low and high output voltages.

The source drain path of transistor 72 shunts the source drain path of transistor 34. The source drain path of field effect transistor 74 is connected in series with the source drain paths of field effect transistors 34, 36 and 38.

During the precharge clock half cycles while CK=0, the voltage at terminal 40, FIG. 3, is high regardless of the values of $IN_0, IN_1 \ldots IN_n$ because CK=0 forward biases the gate of FET 44 so FET 44 has a low source drain impedance to couple $+V_{DD}$ at rail 18 to terminal 40. The CK=0 value back biases the gate of FET 38 to decouple the ground voltage of rail 20 from the source drain path of FET 72 and terminal 40 regardless of the output voltage of inverter 76. The voltage at terminal 24 and across parasitic capacitance 29 (FIG. 3) is also high during the clock half cycles while CK=0 because of the action of FETs 28 and 30, as described supra. The back bias CK=0 applies to the gate of FET 38 prevents the high voltage on lead 24 and across capacitance 29 from being inverted to a low voltage by FET 34 so the voltage on terminal 40 is not affected by the voltage on lead 24 while CK=0.

During the clock half cycles while CK=0, inverter 76 responds to the high voltage at terminal 40 to derive a low voltage output, which persists for the first 100 ps of the next half cycle while CK=1, i.e., for 100 ps after the CK=0 to CK=1 transition. The low voltage output of inverter 76 which exists for 100 ps after the CK=0 to CK=1 transition keeps the source drain path of field effect transistor 72 off so terminal 40 stays decoupled from ground rail 20 despite CK=1 turning on FET 38. The low voltage output of inverter 76 also keeps on the source drain path of field effect transistor 74.

During the CK=1 evaluate clock half cycle, CK=1 back biases the gate of field effect transistor 44 to turn off the source drain path of field effect transistor 44, thereby enabling terminal 40 to be either at a high or low voltage. Simultaneously, CK=1 turns off the source drain path of field effect transistor 28 and turns on the source drain path of field effect transistor 30, thereby enabling lead 24 and capacitance 29 to be substantially at the ground potential of rail 20 or enabling lead 24 to float.

In response to a CK=0 to CK=1 transition while $IN_0$, $IN_1 \ldots IN_n$ all have 0 values, the voltage at lead 24 floats, but has a tendency to stay high, where it was while CK=0 because of the residual high voltage charge across capacitance 29. The residual charge across capacitance 29 causes the source drain path of field effect transistor 34 to remain on while CK=1 turns on the source drain path of field effect transistor 38. Accordingly, terminal 40 is pulled down substantially to the ground potential of rail 20. Simultaneously, the CK=1 applied to the gate of field effect transistor 44 turns off the source drain path of field effect transistor 44 so FET 44 does not couple the $+V_{DD}$ voltage at rail 18 to terminal 40.

The transition from a high voltage to a low voltage at terminal 40 causes inverter 76 to switch state and change from a low voltage output to a high voltage output about 100 ps after the CK=0 to CK–1 transition. The resulting CKE=1 high output voltage of inverter 76 turns off the source drain path of field effect transistor 74 and turns on the source drain path of field effect transistor 72. Since the source drain path of field effect transistor 38 is now turned on by CK=1, the voltage at terminal 40 remains low by virtue of the turned on states of the series connected source drain paths of field effect transistors 38 and 72.

The low voltage at terminal 40 and high output voltage of inverter 76 persist even if one of $IN_0$, $IN_1 \ldots IN_n$ is unstable and has a 0 to 1 transition during the remainder of the evaluate period while CK=1 and CKE=1. This is so even though the voltage across capacitance 29 drops to a low voltage in response to the 0 to 1 transition. No change in the low voltage at terminal 40 occurs because the high voltage (CKE=1) output of inverter 76 turns off the source drain path of field effect transistor 74 and turns on the source drain path of field effect transistor 72. Based on the foregoing, it is not necessary for all of $IN_0$, $IN_1 \ldots IN_n$ to remain at a zero value after the CKE=0 to CKE=1 transition of inverter 76 that occurs approximately 100 ps after a CK=0 to CK=1 transition.

Because of the delay in the output of inverter 76 changing the states of field effect transistors 72 and 74 after a 0 to 1 transition of the clock, the circuit of FIG. 3 does not encounter the problem discussed supra with regard to FIGS. 1 and 1B. If, for example, $IN_0$ has a low to high transition during T4, while CK=1, as illustrated in FIG. 3A, transistors 22$_0$ and 30 provide a low impedance path from lead 24 to ground to discharge capacitor 29 and pull down the voltage on lead 24. The low voltage on lead 24 turns off transistor 34 but turns on transistor 36. This change in state of transistors 34 and 36 has no effect on the voltages at terminal 40 and the output voltage of the circuit that inverter 76 derives because the high voltage at the output of inverter 76 keeps transistor 72 on and keeps transistor 74 off. The CK =1 value results in transistors 38 and 44 being respectively on and off so there are respectively low and high impedance paths from ground rail 20 and $+V_{DD}$ rail 18.

During the next clock half-cycle when CK=0 and $IN_0$ has a high value, inverter 76 derives a low output voltage. The low output voltage of inverter 76 persists for the following clock cycles until there is a high to low transition of one of $IN_0, IN_1 \ldots IN_n$. During the half-cycle when CK=0 and $IN_0$ has a high value, inverter 76 derives a low output voltage. The low output voltage of inverter 76 persists for the following clock cycles until there is a high to low transition of one of $IN_0, IN_1 \ldots IN_n$. During the half-cycle when CK=0 and $IN_0$ has a high value, the CK=0 value turns on transistor 28 and turns off transistor 30 so $+V_{DD}$ charges capacitor 29 through transistor 28. The resulting high voltage on lead 24 turns on transistor 34 and turns off transistor 36. Turning on transistor 34 and turning off transistor 36 has no effect on the voltage of terminal 40 because CK=0 turns off transistor 38 and turns on transistor 44. In consequence, transistor 44 couples the $+V_{DD}$ voltage at rail 18 to node (i.e., terminal) 40 and no low impedance path exists from ground rail 20 to terminal 40.

During the following clock half-cycle, when CK=1, the voltage on lead 24 goes substantially from $+V_{DD}$ to ground. The high to low transition on lead 24 has no effect on the voltages of terminal 40 and at the output of inverter 76. The low voltage on lead 24 turns off transistor 34 and turns on transistor 36 and CK=1 turns off transistor 44. The low voltage at the output of inverter 76 keeps transistor 74 on and transistor 72 off. A low impedance path thus persists from $+V_{DD}$ rail 18 to terminal 40 through transistors 36 and 74 while no low impedance paths exist between terminal 40 and ground rail 20.

When all of $IN_0, IN_1 \ldots IN_n$ return to a zero value, the output inverter 76 of FIG. 3 derives high and low voltages in synchronism with CK=1 and CK=0. When CK=0 and all of $IN_0, IN_1 \ldots IN_n$ are zero $+V_{DD}$, rail 18 charges capacitor 29 through transistor 28. The resulting high voltage on lead 24 has no effect on the voltage on terminal 40 during the CK=0 half-cycle because CK=0 turns off transistor 38 and the high voltage on lead 24 turns off transistor 36. During the next half-cycle, when CK=1 and all of $IN_0, IN_1 \ldots IN_n$ remain low, the charge stored on capacitor 29 during the previous half-cycle persists to turn on transistor 34 while turning off transistor 36.

Simultaneously, CK=1 turns on transistor 38 to provide a low impedance path from terminal 40 to ground rail 20 through transistors 34 and 38. At the same time CK=1 turns off transistor 44 and the high voltage on lead 24 turns off transistor 36 to provide a high impedance path between terminal 40 and $+V_{DD}$ rail 18. Consequently, the voltage at terminal 40 goes low and at the output of inverter 76 goes high while CK=1. During the following clock half-cycle, when CK=0, and all of $IN_0, IN_1 \ldots IN_n$ are low, CK=0 turns on transistor 28 and turns off transistor 30 so rail 18 applies $+V_{DD}$ to terminal 40. CK=0 also turns off transistor 38 to decouple terminal 40 from ground rail 20. Consequently, there is a low to high transition at terminal 40 and a high to low transition at the output of inverter 76.

While there have been described and illustrated plural specific embodiments of the invention, it will be clear that variations in the details of the embodiments specifically illustrated and described may be made without departing from the true spirit and scope of the invention as defined in the appended claims.

I claim:

1. A method of operating a logic circuit, including a dynamic logic stage driving a dynamic evaluation stage, the method comprising:

supplying input signals and a bi-level clock wave to the dynamic logic stage, deriving from the dynamic logic stage a binary signal that is a logic function of the input signals, the dynamic logic stage deriving the binary signal only during a first portion of each cycle of the clock wave, the clock wave having the same value during the first portion, applying the binary signal and the clock wave to the evaluation stage, and activating the evaluation stage so it is responsive to the binary signal for a period that subsists for only an initial segment of the first portion of each cycle of the clock wave.

2. The method of claim 1 further including activating the evaluation stage so it latches one of the binary values of the binary signal until the next cycle of the clock wave begins its initial segment of its first portion and latches the other binary value of the binary signal for only the first portion of each cycle of the clock wave.

3. A logic circuit adapted to be responsive to plural binary input signals and a clock wave, the logic circuit comprising a dynamic logic stage connected to be responsive to the binary input signals and the clock wave for deriving another binary signal that subsists only during a first portion of each cycle of the clock wave, the clock wave having the same value during the first portion, the another binary signal being a predetermined binary function of the input signals, and a dynamic evaluation stage connected to be responsive to the another binary signal and the clock, the evaluation stage being arranged to respond to the another binary signal only during an initial segment of the first portion of each clock cycle.

4. The circuit of claim 3 wherein the dynamic evaluation stage is arranged for latching the value of the another binary signal until the next cycle of the clock wave begins its initial segment of its first portion.

5. The logic circuit of claim 3 further including a delay circuit connected to be responsive to the clock wave, the delay circuit introducing a delay time on the clock wave equal to the duration of the initial segment, whereby the delay circuit derives a second clock wave that is delayed by the duration of the initial segment, the evaluation stage being arranged to respond to the second clock wave so the evaluation stage responds to the another binary signal only during the initial segment.

6. The logic circuit of claim 5 wherein the logic stage includes an output terminal on which the another binary signal is selectively derived, and a switching arrangement connected to be responsive to the clock wave, the switching arrangement being coupled to the output terminal so the another binary signal is decoupled from the evaluation stage during second portions of each cycle of the clock wave that alternate with the first portions of the clock wave.

7. The logic circuit of claim 5 wherein the evaluation stage includes a first switch responsive to the delayed clock wave, the first switch being connected with a second switch responsive to the clock wave, the first and second switches being arranged to enable the evaluation stage to be responsive to the another binary signal starting at a transition of the clock wave at the beginning of the first portion of each clock wave cycle and ending at a transition of the delayed clock wave that occurs in response to the transition of the clock wave at the beginning of the first portion of each clock cycle.

8. A CMOS logic circuit adapted to be responsive to plural binary input signals and a clock wave comprising first and second DC power supply terminals, a dynamic logic stage having plural field effect transistors connected to be responsive to the plural binary input signals and the clock wave for deriving a bi-level logic signal having values determined by the values of the input signals and connections of the plural field effect transistors of the dynamic logic stage, some of the field effect transistors of the dynamic logic stage including field effect transistors having source drain paths connected to the first and second DC power supply terminals and turned on and off in response to the clock wave, the dynamic logic stage being arranged to derive the bi-level logic signal only during first portions of each cycle of the clock wave that alternate with second portions of the cycles of the clock waves, the bi-level signal having a true value in response to the binary input signals having a predetermined relation, and a dynamic evaluation stage connected to be responsive to the bi-level logic signal and the clock wave, the dynamic evaluation stage including complementary field effect transistors having (a) source drain paths connected in a series circuit across the first and second DC power supply terminals and (b) gate electrodes connected to be responsive to the bi-level logic signal, the evaluation stage having an output terminal in the series circuit, and circuitry connected to be responsive to the bi-level logic signal and the clock wave for causing the complementary field effect transistors to be responsive to the bi-level logic signal only during an initial segment of the first portion of each clock cycle.

9. The CMOS logic circuit of claim 8 wherein the evaluation circuit is arranged to latch the bi-level output signal during the remaining segment of the first portion and all of the second portion of each cycle of the clock wave.

10. The CMOS logic circuit of claim 8, further including a circuit for delaying the clock wave for an interval equal to the initial segment of the first portion of the clock wave for deriving a delayed clock wave, the logic and evaluation stages respectively including first and second field effect transistors having series connected source drain paths, the first and second field effect transistors having gate electrodes respectively connected to be responsive to the clock wave and the delayed clock wave so the source drain path of the first transistor is on during the initial segment of the first portion of each cycle of the clock wave and the source drain path of the second transistor is on during a portion of each cycle of the delayed clock wave corresponding to the first portion of each cycle of the clock wave, the evaluation stage being arranged to be enabled when the source drain paths of the first and second field effect transistors are respectively on and off.

11. The CMOS logic circuit of claim 10, wherein the evaluation stage includes a third field effect transistor having a source drain path in series with the source drain paths of the first and second transistors, the third field effect transistor having a gate electrode connected to be responsive to the voltage at the evaluation stage output terminal, the source drain path of the third field effect transistor being turned on until completion of the first portion, the first, second and third field effect transistors being connected in shunt between the second power supply terminal and an output terminal of the dynamic logic stage at which the bi-level logic signal is derived.

12. The circuit of claim 11 wherein the evaluation circuit includes fourth, fifth and sixth field effect transistors, the first, second, third and fourth transistors and a first of the complementary transistors being of a first conductivity type, the fifth and sixth transistors and a second of the complementary transistors being of a second conductivity type, the fourth transistor having a source drain path in the series circuit and a gate electrode connected to be responsive to the clock wave, the fifth transistor having a source drain path in a circuit shunting the source drain path of the second of the complementary transistors and a gate electrode connected to be responsive to the clock wave, the sixth transistor having a source drain path connected between an output terminal on which the bi-level logic signal is derived and the first power supply terminal and a gate electrode connected to be responsive to the voltage at the evaluation stage output terminal.

13. The CMOS logic circuit of claim 8 wherein the evaluation stage includes circuitry connected to be responsive to the bi-level logic signal for deriving a delayed bi-level output signal, the delay of the bi-level logic signal being a fraction of the first portion of the clock wave equal to the duration of the initial segment, the evaluation stage including first and second field effect transistors having series connected source drain paths, the first and second field effect transistors having gate electrodes respectively connected to be responsive to the clock wave and the delayed bi-level logic signal so the source drain path of the first transistor is on during the first portion of each cycle and the source drain path of the second transistor is on during portions of the delayed bi-level logic signal corresponding to the first portions of the clock wave.

14. The CMOS logic circuit of claim 13 further including a third field effect transistor having a source drain path connected in a path shunting one of the complementary transistors and in series with the source drain path of the first field effect transistor, the third field effect transistor having a gate electrode connected to be responsive to the delayed bi-level logic signal so that the source drain path of the third field effect transistor is on in response to the delayed bi-level logic signal having a value associated with the bi-level logic signal having the true value.

15. The circuit of claim 14 futher including an inverter connected to be responsive to the voltage at the output terminal of the evaluation stage, the inverter deriving the delayed output signal.

16. The CMOS logic circuit of claim 8 wherein the evaluation stage includes circuitry connected to be responsive to the bi-level logic signal for deriving a delayed bi-level logic signal, the delay of the delayed bi-level logic signal being a fraction of the first portion of the clock wave equal to the duration of the initial segment, a first field effect transistor having a source drain path connected in the series circuit, the first field effect transistor having a gate electrode connected to be responsive to the clock wave so that during the first portions of the clock wave the source drain path of the first transistor is on, a second field effect transistor having a source drain path connected in shunt with one of the complementary transistors and in series with the source drain path of the first field effect transistor, the second field effect transistor having a gate electrode connected to be responsive to the delayed bi-level logic signal so that the source drain path of the second field effect transistor is on in response to the delayed bi-level logic signal having a value associated with the bi-level logic signal having the true value.

17. The circuit of claim 16 further including an inverter connected to be responsive to the voltage at the output terminal of the evaluation stage, the inverter deriving the delayed logic signal.

18. The CMOS logic circuit of claim 16 further including a fourth field effect transistor of a type complementary to the third field effect transistor, the fourth field effect transistor having a source drain path in the series circuit, the fourth field effect transistor having a gate electrode connected to be responsive to the delayed bi-level output signal so that the source drain path of the fourth field effect transistor is off in response to the delayed bi-level logic signal having a value associated with the bi-level logic signal having the true value.

19. The circuit of claim 18 further including an inverter connected to be responsive to the voltage at the output terminal of the evaluation stage, the inverter deriving the delayed output signal.

20. The circuit of claim 8 further including an inverter connected to be responsive to the voltage at the evaluation stage output terminal for deriving a delayed replica of the voltage at the evaluation stage output terminal, the evaluation stage including first, second, third and fourth field effect transistors, the first and second transistors having source drain paths in the series circuit and gate electrodes respectively connected to be responsive to the clock wave and the delayed replica, the third transistor having (1) a source drain path connected in a first path shunting (a) a first of the complementary transistors and (b) the second transistor and (2) a gate electrode connected to be responsive to the clock wave, the first path including the third transistor being connected between the evaluation stage output terminal and one of the power supply terminals, the fourth transistor having a source drain path in a second path shunting a second of the complementary transistors, the second path having a connection to the evaluation stage output terminal, the fourth transistor having a gate electrode connected to be responsive to the delayed replica, the second and third transistors and the first complementary transistor being of a first conductivity type, the first and fourth transistors and the second complementary transistor being of a second conductivity type.

* * * * *

(12) EX PARTE REEXAMINATION CERTIFICATE (5755th)
United States Patent
Arnold

(10) Number: US 6,377,080 C1
(45) Certificate Issued: May 1, 2007

(54) DYNAMIC LOGIC CIRCUIT

(75) Inventor: Barry J Arnold, Ft. Collins, CO (US)

(73) Assignee: Hewlett-Packard Company, Ft. Collins, CO (US)

Reexamination Request:
No. 90/006,333, Jul. 23, 2002

Reexamination Certificate for:
Patent No.: 6,377,080
Issued: Apr. 23, 2002
Appl. No.: 09/561,081
Filed: Apr. 28, 2000

(51) Int. Cl.
*H03K 19/096* (2006.01)

(52) U.S. Cl. .................. 326/98; 326/93; 326/95; 326/121; 326/97

(58) Field of Classification Search ............ 326/93–98, 326/112, 191, 121
See application file for complete search history.

(56) References Cited

U.S. PATENT DOCUMENTS

| | | |
|---|---|---|
| 3,935,474 A | 1/1976 | Komarek |
| 4,700,086 A | 10/1987 | Ling et al. |
| 4,899,066 A | 2/1990 | Aikawa et al. |
| 5,291,076 A | 3/1994 | Bridges et al. |
| 5,831,452 A | 11/1998 | Nowal et al. |
| 5,990,706 A | 11/1999 | Matsumoto et al. |
| 6,172,531 B1 | 1/2001 | Aipperspach et al. |

OTHER PUBLICATIONS

U.S. Appl. No. 09/510,975, Naffziger et al.

U.S. Appl. No. 09/989,230, Naffziger et al.

*Primary Examiner*—Don Le

(57) ABSTRACT

A logic circuit includes a dynamic logic stage driving a dynamic evaluation stage. The dynamic logic stage responds to input signals and a clock wave to derive an output signal that is a logic function of the input signals. The output signal is derived only during a first portion of each cycle of the clock wave. The evaluation stage responds to the output signal only during an initial segment of the first portion of each clock wave cycle.

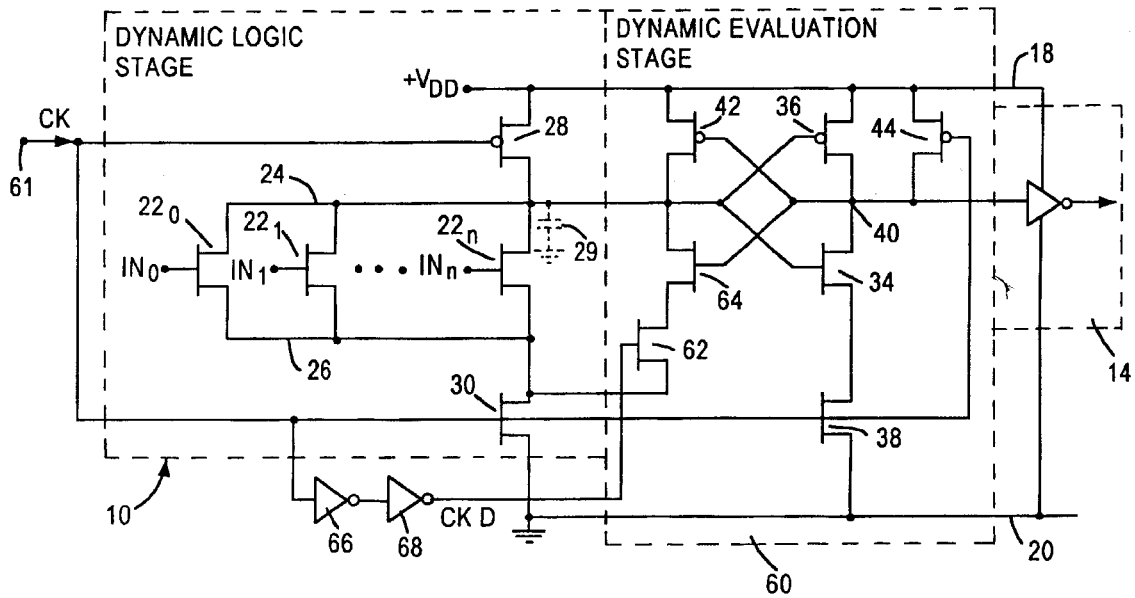

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8–20 is confirmed.

Claims 1–3 are cancelled.

Claims 4, 5 and 7 are determined to be patentable as amended.

Claim 6, dependent on an amended claim, is determined to be patentable.

4. The circuit of claim [3] *7* wherein the dynamic evaluation stage is arranged for latching the value of the another binary signal until the next cycle of the clock wave begins its initial segment of its first portion.

5. The logic circuit of claim [3] *7* further including a delay circuit connected to be responsive to the clock wave, the delay circuit introducing a delay time on the clock wave equal to the duration of the initial segment, whereby the delay circuit derives a second clock wave that is delayed by the duration of the initial segment, the evaluation stage being arranged to respond to the second clock wave so the evaluation stage responds to the another binary signal only during the initial segment.

7. [The] *A* logic circuit [of claim 5 wherein] *adapted to be responsive to plural binary input signals and a clock wave, the logic circuit comprising:*

*a dynamic logic stage connected to be responsive to the binary input signals and the clock wave for deriving another binary signal that subsists only during a first portion of each cycle of the clock wave, the clock wave having the same value during the first portion, the another binary signal being a predetermined binary function of the input signals, and*

*a dynamic evaluation stage connected to be responsive to the another binary signal and the clock, the evaluation stage being arranged to respond to the another binary signal only during an initial segment of the first portion of each clock cycle* the evaluation stage [includes] *including* a first switch responsive to [the] *a* delayed clock wave, the first switch being connected with a second switch responsive to the clock wave, the first and second switches being arranged to enable the evaluation stage to be responsive to the another binary signal starting at a transition of the clock wave at the beginning of the first portion of each clock wave cycle and ending at a transition of the delayed clock wave that occurs in response to the transition of the clock wave at the beginning of the first portion of each clock cycle.

\* \* \* \* \*